United States Patent [19]

Pujolle et al.

[11] 4,204,432
[45] May 27, 1980

[54] ACOUSTIC INSULATION MEASUREMENT APPARATUS

[75] Inventors: Jean Pujolle, Paris; Patrice Bourcet, Franconville-la-Garenne, both of France

[73] Assignee: Telediffusion de France, Paris, France

[21] Appl. No.: 13,444

[22] Filed: Feb. 21, 1979

[30] Foreign Application Priority Data

Feb. 24, 1978 [FR] France .................................. 78 05372

[51] Int. Cl.$^2$ ............................................. G01N 29/00
[52] U.S. Cl. ...................................................... 73/599
[58] Field of Search ...................... 73/599, 589; 367/13

[56] References Cited

U.S. PATENT DOCUMENTS

1,712,515  5/1929  Norris .................................... 73/599

Primary Examiner—Anthony V. Ciarlante
Attorney, Agent, or Firm—Abraham A. Saffitz

[57] ABSTRACT

Device enabling the direct measurement of the overall insulation level of an acoustic insulation medium with respect to a reference excitation noise signal when said medium is subject to an actual excitation noise signal deviating from the reference excitation noise signal. The device comprises two microphones receiving a first and a second alternating signal respectively representing the noise signal actually transmitted through the medium and the actual excitation noise signal and a read only memory storing spectral components of the reference excitation noise signal in a plurality of given spectral bands. The first and the second alternating signals are decomposed into alternating spectral components in these spectral bands and the alternating spectral components of the second signal are rectified in order to obtain rectified spectral components. These rectified spectral components are added to the alternating spectral components of the first signal relating to the same spectral bands thereby obtaining composite signals each having a direct and an alternating component. These composite signals are selectively passed through attenuators thereby forming attenuated alternating spectral components and attenuated rectified spectral components which are separated from each other. The attenuated rectified spectral components are compared to the spectral components of the reference excitation noise signal relating to the same spectral bands and thereby error signals are obtained respectively corresponding to the spectral bands, and these error signals control the attenuators.

3 Claims, 3 Drawing Figures

ACOUSTIC INSULATION MEASUREMENT APPARATUS

BACKGROUND OF THE INVENTION

1. Field of the Invention

The present invention relates in general to the measurement of acoustic insulation of construction such as building frontages, walls, partitions, anti-noise screens, ... and more particularly to such measurements when the noise source affecting the structure produces a noise deviating from a reference sound.

A situation of this kind arises frequently in practice, particularly in architectural acoustics, when, for example, the insulating of a building frontage from a reference sound is to be measured, for instance the noise caused by average road traffic. Measurement does not present a particular problem if it is possible to test the system in question directly against the reference sound itself. The problem becomes more complicated when there is no reference sound available to test the system, when for example the building frontage is not subject to the noise of average road traffic.

2. Description of the Prior Art

There are several known devices capable of solving the problem of the direct measurement of an acoustic insulation when the affecting noise deviates from the reference noise by its level, or by its level and its spectral power density if the latter difference is known and does not vary during the measurement. In both cases, the measurement is, in effect, the measurement of the ratio of two quantities, one of the quantities being compared to the other after the spectral correction corresponding to a possible known difference. In all of the other cases, a direct measurement is not possible; two sets of measurements are then required, one enabling the spectral power density of the noise in effect affecting the system to be determined, the other that of the noise in effect transmitted by the system. The results obtained then enable an independent calculation of either the insulation of the system with respect to the reference noise or the level at which this noise is transmitted by the system, the two results being equivalent as their total correspond to the reference noise level. The use of a calculation also enables a possible weighting to be introduced very simply so that a subjective level may be evaluated instead of an objective level. A protocol detailing the measurements and calculations to be carried out, in particular with respect to measuring the insulation of buildings from aircraft noise in relation to noises external to the building, is given in Appendix III Chapter II of the circular No. 72-110 of June 29, 1972 concerning the "Acoustic comfort Label" of the French Ministry of Equipment and Housing and the French Ministry of Transports, sold by the French National Press as a special pamphlet No. 72-54 bis.

If the above operations enable the problem to be solved, they do not enable the result required to be obtained directly and quickly by means of an automatic apparatus.

SUMMARY OF THE INVENTION

The object of the invention is an automatic device enabling a measurement of acoustic insulation to be carrier out with respect to a reference noise, when the difference between the spectral power density of the noise in effect affecting the system being tested and the spectral power density of the reference noise is not known or, more critically, when this difference varies in terms of time during the same measurement.

The invention consists in the introduction into the measuring apparatus used as a level indicator, for example, a sound level meter, of correction means controlled by the difference between the spectral power density of the reference noise (possibly weighted) and the spectral power density of the noise affecting in fact the system being tested. This operation results in the constant conversion of the actual characteristics of the noise transmitted by the system and taken into account by the measuring device, so that they become identical to those which should have been obtained if the system has been excited by the reference noise (possibly weighted) and they are integrated by the level indicator used in this new form.

BRIEF DESCRIPTION OF THE DRAWINGS

A more detailed description of the invention will now be given, using as an example a spectrum modifying apparatus designed to be inserted in a sound level meter, with reference to the attached drawings, in which.

DESCRIPTION OF THE PREFERRED EMBODIMENT

Figure 1:
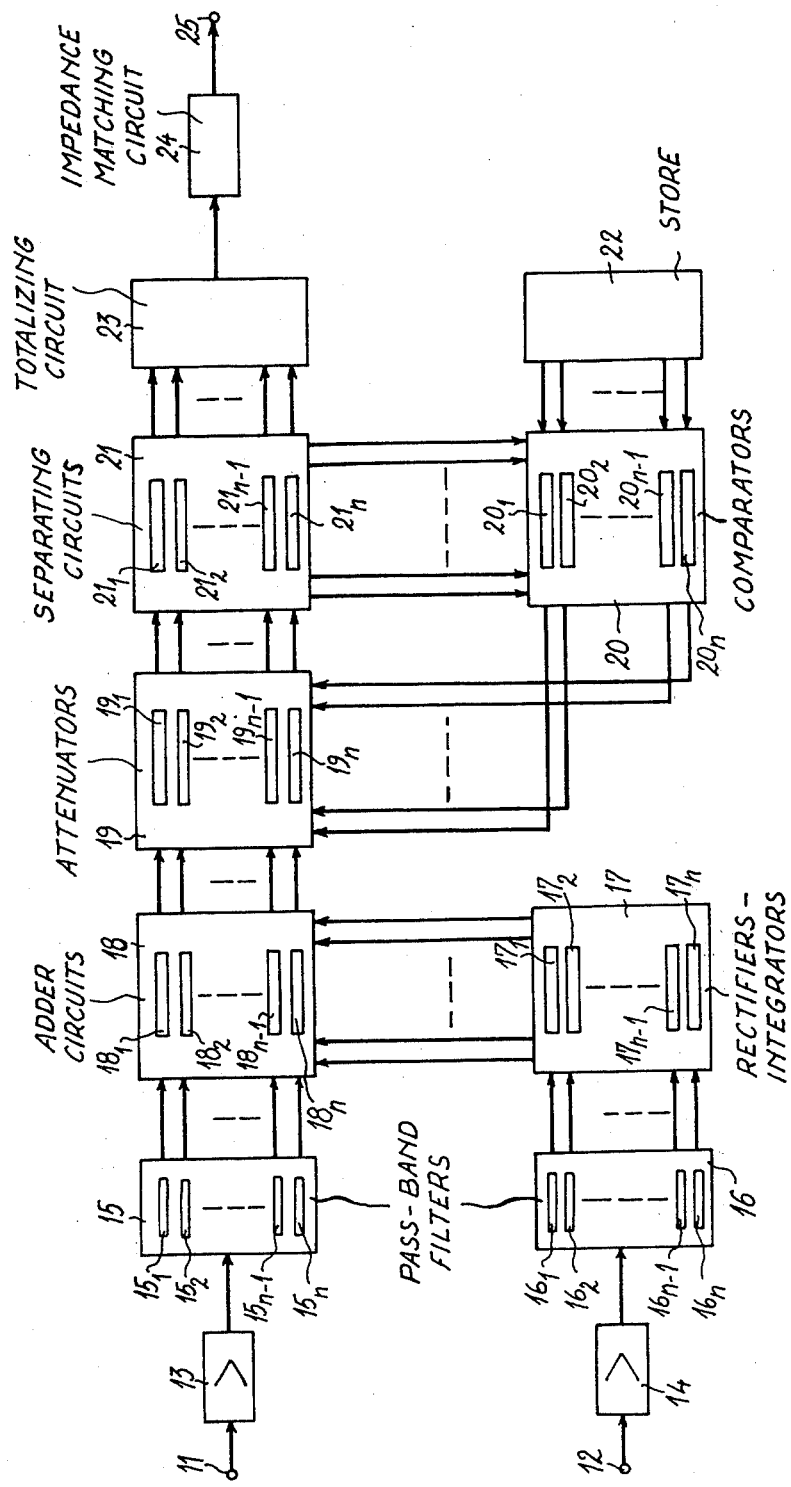
FIG. 1 is an outline in the form of a block diagram of the spectrum modifying apparatus of the invention.

With reference to FIG. 1, the two inputs of the apparatus are respectively designated by 11 and 12 and respectively receive the noise transmitted through the medium whose insulation is required to be known and the excitation noise generated in front of said medium. The inputs 11 and 12 are respectively connected to amplifiers 13 and 14 for regulating the noise level and they are connected to filter banks 15 and 16 each constituted by n bandpass filters which are identical in two $15_1$ to $15_n$ and $16_1$ to $16_n$ which serve to decompose the transmitted noise and the excitation noise into n frequency bands respectively which are treated separately by the following circuits. The filter bank 16 is connected to a set 17 of n integrators rectifiers $17_1$ to $17_n$ whose role is to convert the n signals provided by the filters $16_1$ to $16_n$ into n d.c. voltages representing the effective values of the spectral power density of the excitation noise.

The outputs of the band-pass filter bank 15 and those of the bank of integrators rectifiers 17 are applied to a set 18 of adder circuits $18_1$ to $18_n$ which add in pairs the n alternating voltages coming from 15 to the n direct voltages coming from 17 and thereby form composite signals each having a d.c. component and an alternating component. The integration time constants used in the integrator circuits $17_1$ to $17_n$ are sufficiently high to enable each signal provided by the circuits $18_1$ to $18_n$ to be constituted by two components which are clearly distinguishable in frequency.

The set of adder circuits 18 is connected to a set 19 of n variable attenuators (or amplifiers) $19_1$ to $19_n$ of the voltage controlled type. These attenuators are controlled respectively by n error voltages coming from a circuit 20 which will be discussed below and act separately on the n signals from circuit 18.

Following the circuit 19, there is a circuit 21 enabling the d.c. components introduced by the circuit 18 to be recovered.

A memory circuit 22 provides n direct voltages representing the spectral power density of the reference noise or this density weighted if a final level having a subjective value is to be obtained directly, in particular expressed in weighted decibels A. This memory circuit is connected to the n first inputs of a set 20 of comparators $20_1$ to $20_n$ which receives at its no second inputs the d.c. components recovered by the circuit 21. These n comparators $20_1$ to $20_n$ provide the n control voltages required by the circuit 19. By acting on the variable elements of the circuits 19, each comparator of the circuit 20 ensures the permanent equality of the n voltages recovered by the circuit 21 and the n reference voltages in accordance with the well known principle used currently in the design of stabilized or regulated feeds.

A totalizing circuit 23 recomposing the n alternating signals after their spectral correction and an impedance matching circuit 24 enable the output impedance of the device to be reduced as far as possible.

It can thus be seen that by ensuring the permanent equality term by term of two sets of d.c. voltages the circuit 20 introduces, by means of the circuit 19, a spectral correction which is equal to the difference between the excitation noise power density and the reference noise power density, even when this difference varies in time. The accuracy of the correction basically depends on the number of filters used and the number n is consequently selected.

Considering that the signal representing the noise transmitted through the medium which constitutes the alternating components of the composite signal exactly undergoes the same spectral correction as the excitation noise which constitutes the d.c. components of the composite signal and that pairs of associated alternating and d.c. components corresponding to the same frequency band pass respectively through the same attenuators, the signal reconstituted by the totalizing circuit has the characteristics of the signal which would have been obtained if the excitation noise had been the reference noise, possibly weighted. A perfect correction is not possible, as has also been the case in the prior art, taking into account the necessarily finite resolution with which a spectral density of noise may be determined.

The device according to the invention may be easily adapted to any reference noise; it is sufficient to select a read only memory among several switchable memories according to the reference noise required by the measurement.

Figure 2:
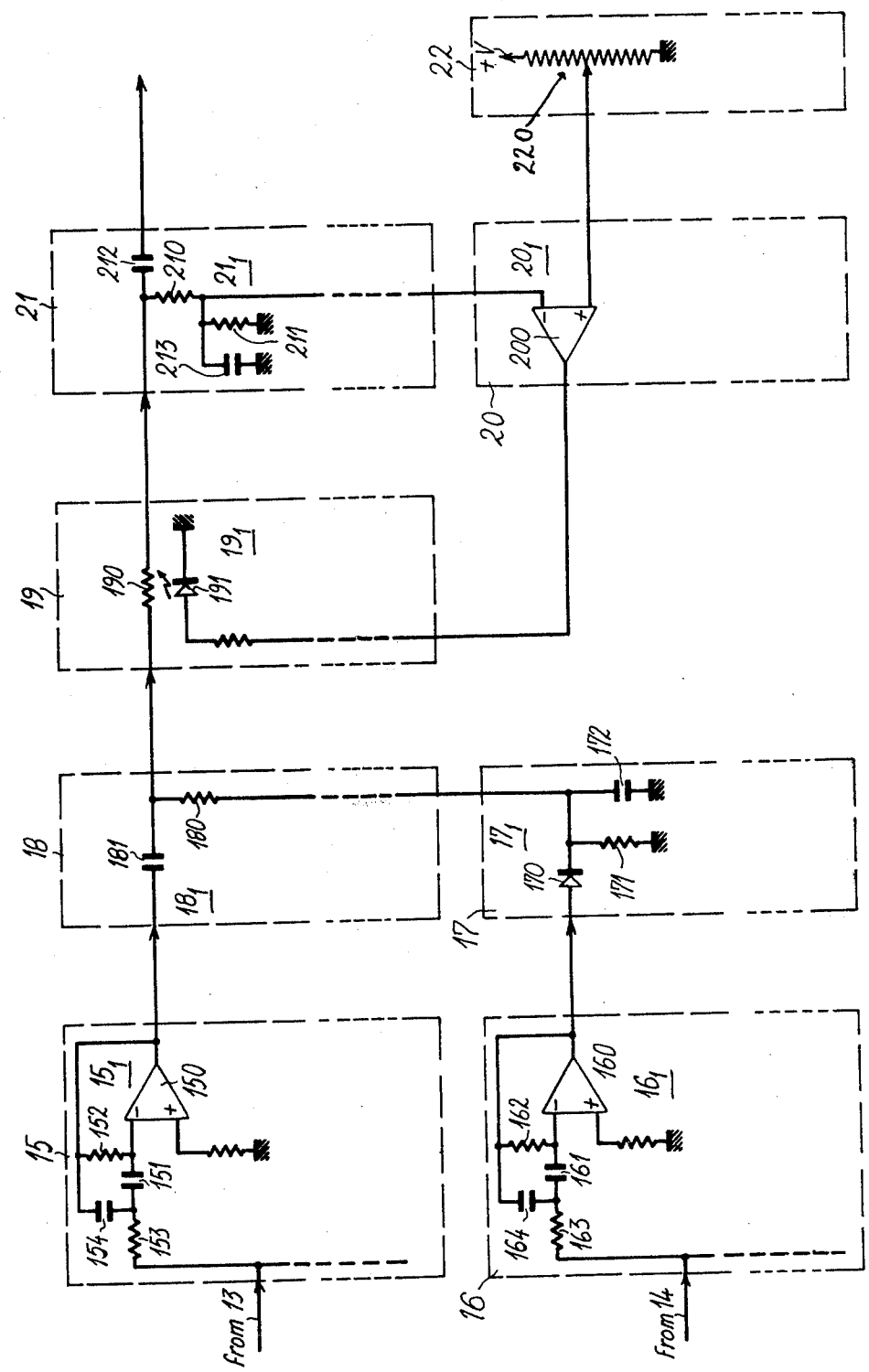
FIG. 2 is a more detailed scheme of this apparatus showing, for each of the blocks of FIG. 1, the structure of the electrical elements in this block.

In FIG. 2 a diagram indicating the structure of each of the n circuits constituting the circuit sets 15, 17, 19, 21, 16, 17, 20 and 22 in more detail has been illustrated by way of simple example.

The band-pass filter $15_1$ of the filter bank 15 is a Rauch filter of the second order. It comprises the operational amplifier 150, an input series capacitor 151, a feed-back resistor 152 forming the first cell of the filter, an input series resistor 153 and a feed-back capacitor 154 forming the second cell of the filter. The band-pass filter $16_1$ of the filter bank 16 is identical to the filter $15_1$. Its elements 160–164 are identical respectively to the elements 150–154.

The integrator rectifier $17_1$ comprises a diode 170 and an R-C load circuit 171–172. The adder circuit $18_1$ comprises the resistance 180 and the capacitor 181. The voltage controlled attenuator $19_1$ used in the attenuator bank 19 is a photo-resistor 190 actuated by a light emitting diode 191.

The separating circuit for the d.c. component $21_1$ comprises the voltage divider 210, 211 and the capacitors 212 and 213.

The comparator $20_1$ is an operational amplifier 200.

The memory 22 comprises a plurality of potentiometers of which only one 220 is shown.

Figure 3:
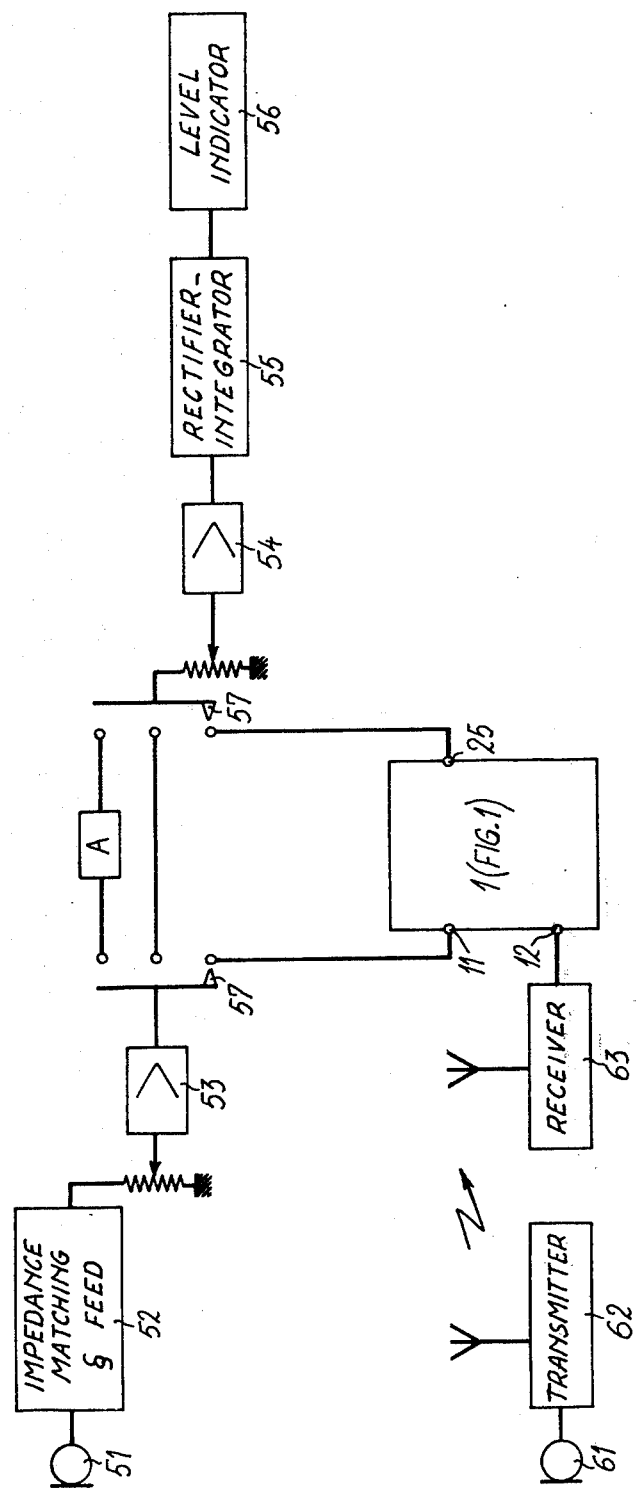
FIG. 3 shows the apparatus according to the invention incorporated into a sound level meter.

With reference now to FIG. 3, the spectrum modifying device according to the invention has been shown connected to a sound level meter by connecting its input terminals 11 and output terminals 25 to the terminals 57 which are generally provided in sound level meters for the connection of an external filter.

The sound level meter conventionally comprises:
a microphone 51;
a microphone feed and an impedance matching circuit 52;
an input amplifier 53;
an output amplifier 54;
a detector integrator 55; and
a decibel level indicator 56.

The acoustic pressure due to the noise passing through the isolation acoustic medium undergoing the test is converted into an electrical signal by a second microphone 61 whose signal may possibly be transmitted by a transmitter 62 and received by a receiver 63, thus leaving the sound level meter autonomous, without connecting wires. The elements 63 and 1 may advantageously be coupled to the sound level meter in the form of a small additional casing.

The new apparatus constituted in this way enables the measurement of an acoustic insulation to be directly obtained with respect to a reference noise. In addition, this device may also serve as a detector of insulation defects. This requires only the replacement of the adder circuit 23 (FIG. 1) by a switch enabling the levels of the n paths to be read successively and consequently to locate the band(s) of frequency which are best transmitted.

What we claim is:

1. A device enabling the direct measurement of the overall insulation level of an acoustic insulation medium with respect to a reference excitation noise signal when said medium is subject to an actual excitation noise signal deviating from the reference excitation noise signal, the said device comprising:

first input means receiving a first alternating electrical signal representing the noise signal actually transmitted through said medium;

second input means receiving a second alternating electrical signal representing the actual excitation noise signal;

a read only memory storing spectral components of the reference excitation noise signal in given spectral bands;

means for decomposing the first and the second alternating signals into alternating spectral components in the same spectral bands;

means for rectifying the spectral components of the second signal in order to obtain rectified spectral components;

means for adding said rectified spectral components of the second signal and said alternating spectral components of the first signal relating to the same spectral bands in pairs so that composite signals are obtained;

means for selectively attenuating said composite signals;

means for separating in the attenuated composite signals the attenuated alternating spectral components and the attenuated rectified spectral components;

means for comparing the attenuated rectified spectral components to the spectral components of the reference excitation noise signal relating to the same spectral bands and for deriving therefrom error signals respectively corresponding to said spectral bands; and means for controlling said attenuating means by said spectral band error signals.

2. A device enabling direct measurement of the overall insulation level of an acoustic insulation medium as set forth in claim 1, in which the said acoustic insulation medium is a building wall, the first input means is a first microphone inside said building, receiving the noise signal actually transmitted through said wall and the second input means is a second microphone outside said building, receiving the actual excitation noise signal.

3. A device enabling the direct measurement of the overall insulation level of an acoustic insulation medium as set forth in claim 1, in which the said acoustic insulation medium is a building wall, the first input means is a microphone inside said building, receiving the noise signal actually transmitted through said wall and the second input means is a radiofrequency receiver inside said building receiving a radiotransmitted actual excitation noise signal.

* * * * *